United States Patent
Klostermann et al.

(10) Patent No.: US 7,602,032 B2
(45) Date of Patent: Oct. 13, 2009

(54) MEMORY HAVING CAP STRUCTURE FOR MAGNETORESISTIVE JUNCTION AND METHOD FOR STRUCTURING THE SAME

(75) Inventors: Ulrich Klostermann, Fontainebleau (FR); Chanro Park, Samois sur Seine (FR); Wolfgang Raberg, Fontainebleau (FR)

(73) Assignees: Altis Semiconductor SNC, Corbeil Essonnes Cedex; Infineone Technologies AG, Munich (DE)

( * ) Notice: Subject to any disclaimer, the term of this patent is extended or adjusted under 35 U.S.C. 154(b) by 421 days.

(21) Appl. No.: 11/117,854

(22) Filed: Apr. 29, 2005

(65) Prior Publication Data

US 2006/0245116 A1 Nov. 2, 2006

(51) Int. Cl.
*H01L 29/82* (2006.01)
(52) U.S. Cl. ................ 257/421; 257/422; 438/3; 438/8; 438/634; 438/740
(58) Field of Classification Search ........ None
See application file for complete search history.

(56) References Cited

U.S. PATENT DOCUMENTS

| | | | |
|---|---|---|---|
| 2003/0179496 A1* | 9/2003 | Jayasekara | 360/99.09 |
| 2003/0180968 A1 | 9/2003 | Nallan et al. | |
| 2003/0186552 A1* | 10/2003 | Amano et al. | 438/694 |
| 2004/0084400 A1 | 5/2004 | Costrini et al. | |
| 2005/0051820 A1 | 3/2005 | Stojakovich et al. | |
| 2005/0097725 A1* | 5/2005 | Baseman et al. | 29/603.14 |
| 2006/0022286 A1* | 2/2006 | Leuschner et al. | 257/421 |

FOREIGN PATENT DOCUMENTS

| | | |
|---|---|---|
| DE | 19728473 | 1/1999 |
| DE | 102004043855 | 5/2005 |
| EP | 1248305 | 10/2002 |
| WO | 2004040602 | 5/2004 |

* cited by examiner

*Primary Examiner*—Evan Pert
*Assistant Examiner*—Tan Tran
(74) *Attorney, Agent, or Firm*—Dicke, Billig & Czaja PLLC

(57) ABSTRACT

A memory and method of making a memory is disclosed. In one embodiment, the memory includes a cap structure for a magnetoresistive random access memory device including an etch stop layer formed over an upper magnetic layer of a magnetoresistive junction (MTJ/MCJ) layered structure and a hardmask layer formed over said etch stop layer, wherein said etch stop layer is selected from a material such that an etch chemistry used for removing said hardmask layer has selectivity against etching said etch stop layer material. In a method of opening the hardmask layer, an etch process to remove exposed portions of the hardmask layer is implemented, where the etch process terminates on the etch stop layer.

12 Claims, 5 Drawing Sheets

PRIOR ART

PRIOR ART

MEMORY HAVING CAP STRUCTURE FOR MAGNETORESISTIVE JUNCTION AND METHOD FOR STRUCTURING THE SAME

FIELD OF THE INVENTION

The present invention is in the field of non-volatile semiconductor memory chips, in particular magnetoresistive random access memory chips, a cap structure for a magnetoresistive junction and an improved process of structuring the same.

BACKGROUND

In a magneto-resistive random access memory (MRAM) device, a plurality of memory cells (MRAM cells) are typically arranged at intersections of first and second conductive lines (e.g., bit and word lines) typically in intermediate positions thereof. Each of the MRAM cells generally comprise a magnetic structure (magnetoresistive tunnel junction or MTJ) where information is stored in form of directions of magnetization in a magnetic layer of the MTJ. Such stored information can be preserved for long periods of time without the need of further applying energy.

In general, the MTJ comprises two magnetic layers of different coercivity that are separated by an insulating tunneling barrier layer made of non-magnetic material. More particularly, magnetization of one of the magnetic layers ("reference layer") is fixed or pinned, while magnetization of the other magnetic layer ("free layer") is free to be switched between two preferred directions along a preferred axis ("easy axis") of magnetization thereof.

Writing of logic information into an MRAM cell is accomplished by causing the magnetic material of the free layer to be magnetized in either one of the two directions along the preferred axis of magnetization, which typically is caused by coupling magnetic fields to the magnetic free layer. The magnetic fields typically are created passing currents through the first and second conductive lines. Changing directions of the magnetization of the free layer is also called a "writing or programming operation."

Since a tunneling current through the MTJ is dependent on a relative orientation of the magnetizations in the magnetic layers thereof, reading of logic information (magnetic states) of an MRAM cell can be accomplished by sensing electrical resistance of the MTJ, for which purpose an electric voltage across the MTJ is applied.

A conventional process of manufacturing MRAM cells is now described referring to FIGS. 1 and 2 illustrating sectional views of intermediate products in a fabrication process thereof. While not illustrated in the drawings, typically and according to the afore-mentioned structure, a semiconductor substrate comprising active structures that have been processed beforehand (typically in a typical CMOS front-end-of-line processing) is provided, on which an interlevel dielectric is deposited. Then, a metallization level is formed within the interlevel dielectric material to form the first conductive lines, followed by deposition of an MTJ layered structure 10 which is to be structured for manufacturing a plurality of MTJ stacks, each of the latter functioning as memory element of the MRAM cells. The MTJ layered structure typically comprises a reference layer 1 on top of an antiferromagnetic layer 4 for pinning of the reference layer 1 fixed magnetization, a tunneling barrier layer 3 above the reference layer 1 and a free layer 2 above the tunneling barrier 3 (deposition in reverse order is also possible). Below the antiferromagnetic layer 4, electrically conductive layers can be deposited on the first conductive lines, for example a first conductive layer 6 made of TaN deposited on the first conductive lines and a second conductive layer 5 made of Ta deposited on the first conductive layer 6.

The reference layer 1 typically is made of thin films, for example, consisting of ferromagnetic alloys such as NiFe and CoFe with non-magnetic spacers of Ru, Re, Os, Nb, Cr or alloys thereof. The pinning (antiferromagnetic) layer 4 typically consists of platinum manganese (PtMn) or iridum manganese (IrMn). The free layer 2 typically is made of thin films, for example, ferromagnetic materials with or without non-magnetic spacers such as Ru, Re, Os, Nb, Cr or alloys thereof. The tunneling barrier layer 3 typically is made of $Al_2O_3$.

In the process of manufacturing MRAM cells, after depositing the MTJ layered structure 10 a cap structure 11 is formed thereupon. The cap structure 11 necessarily comprises a protective cap layer 7 formed over an upper magnetic layer (e.g. free layer 2) of the MTJ layered structure 10 that typically has a thickness of several hundred atomic layers, and which is to protect the MTJ layered structure 10 against exposure to the ambient, such as oxidation thereof. The cap layer 7 typically consists of a conductive material such as tantalum (Ta), tantalum nitride (TaN) or titanium nitride (TiN).

The cap structure 11 further comprises a hardmask layer 8 formed on the cap layer 7 to be subsequently opened for patterning of the MTJ stacks. Usually, a conductive material is used for the hardmask layer 8 which typically is the same or similar to the material of the cap layer 7, such as Ta, TaN or TiN, thus resulting in poor etch selectivity of the hardmask layer 8 with respect to the cap layer 7.

To transfer a lithographic pattern to the MTJ stacks, the hardmask layer 8 is patterned typically using reactive ion etching (RIE) down to the upper magnetic layer of the MTJ stack (i.e. opening of the hardmask layer and cap layer 7), followed by resist-strip and RIE of the MTJ stack.

For a good control of magnetic properties as well as enabling certain integration schemes it is necessary to stop the hardmask opening process reliably at the freelayer 2 surface without damaging the free layer 2, which, however, would require a very high etch selectivity (ca. more than 80) of the hardmask opening etch chemistry with respect to the free layer 2 material. However, according to the poor etch selectivity of the hardmask layer 8 with respect to the cap layer 7 as above-described, the free layer 2 magnetic material is very likely to be damaged in the hard mask opening process. Accordingly, in practical use, the hardmask open process is very sensitive to any non-uniformity over the wafer surface and typically works only with timed etch.

Particular reference is now made to FIG. 2 depicting that in opening the hardmask layer 8, due to poor etch selectivity of the hardmask layer 8 with regard to the cap layer 7, etch damage may occur in damage zones 9 of the MTJ layered stack 10, especially in the free layer 2.

In light of the above, there is a need to provide a new cap structure and a method of structuring same, while ensuring opening of the hardmask layer for patterning the MTJ stacks without causing damage to the MTJ layered structure.

SUMMARY

Embodiments of the present invention provide a memory and method of making the memory. In one embodiment, the invention provides a random access memory including a magnetoresistive junction having an upper magnetic layer, a cap structure including an etch stop layer formed over the upper magnetic layer, and a hardmask layer formed over the etch stop layer. The etch stop layer is selected from a material such that an etch chemistry used for removing the hardmask layer has selectivity against etching the etch stop layer material.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
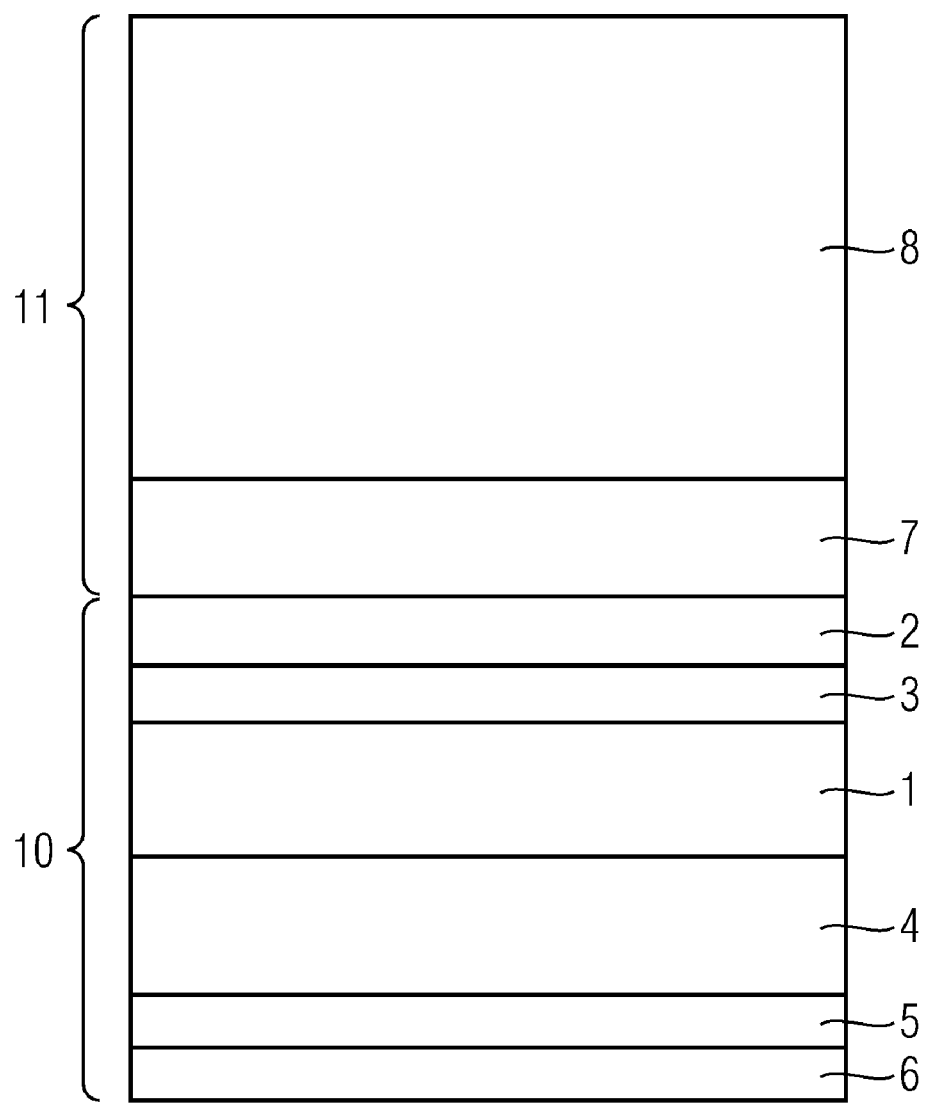
FIG. 1 is a cross sectional view of an intermediate product of a conventional MRAM layered structure with cap structure.
Figure 2:
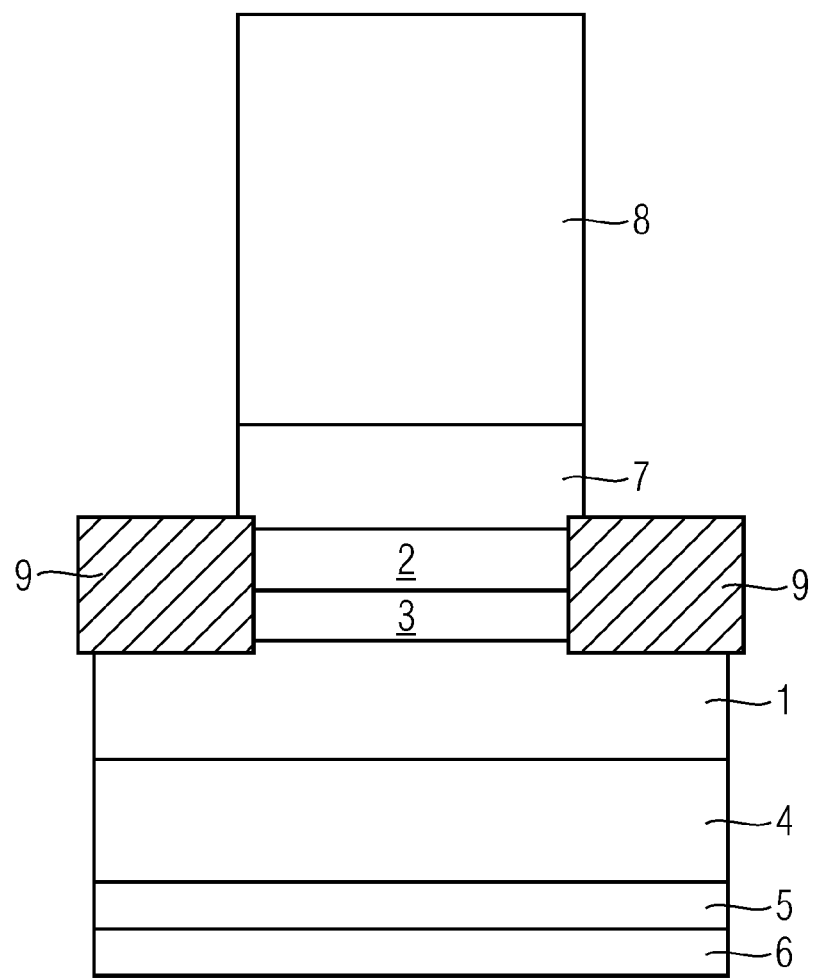
FIG. 2 illustrates the intermediate product of FIG. 1 after opening the hardmask layer.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides an MRAM including a cap structure for a magnetoresistive junction layered structure and a method for structuring same, as well as a method of structuring magnetoresistive junction stacks.

As used in the present invention, the term "magnetoresistive junction" (MRJ) is intended to both comprise a magnetoresistive tunneling junction (MTJ) as is used in coventional magnetoresistive tunneling elements (MTJ elements) comprising a dielectric spacer layer (tunneling barrier) in between magnetic free and reference layers and a magnetoresistive conductive junction (MCJ) as is used in conventional giant magnetoresistive elements (GMR elements) comprising a non-magnetic, conductive spacer layer (conductive barrier) in between magnetic free and reference layers. In order to identify both the magnetoresistive tunneling junction (MTJ) and the magnetoresistive conductive junction (MCJ), which are envisaged in the present invention as alternatives, the term "MTJ/MCJ" is used herein.

According to one embodiment of the invention, a cap structure for a magnetoresistive random access memory device (more particularly MTJ/MCJ layered structure) including an etch stop layer formed over an upper magnetic layer of a magnetoresistive junction MTJ/MCJ layered structure and a hardmask layer that is formed over the etch stop layer. The MTJ/MCJ layered structure which is a layered stack is for manufacturing a plurality of MTJ/MCJ stacks of MRAM cells.

The etch stop layer is selected from a material such that an etch chemistry used for removing the hardmask layer has selectivity against etching of the etch stop layer material.

According to a further embodiment of the invention, a cap structure for a magnetoresistive random access memory device (more particularly MTJ/MCJ layered structure) includes an etch stop layer formed over an upper magnetic layer of an MTJ/MCJ layered structure, a cap layer formed over the etch stop layer, and a hardmask layer formed over the cap layer. The etch stop layer is selected from a material such that an etch chemistry used for removing said hardmask layer has selectivity against etching the etch stop layer material.

According to another embodiment of the invention, a method of opening a hardmask layer of an MRAM device includes patterning a photoresist layer formed over the hardmask layer and implementing an etch process to remove exposed portions of the hardmask layer. The etch process terminates on an etch stop layer formed over an upper magnetic layer of an MTJ/MCJ layered structure. Then, the etch stop layer is removed.

According to another embodiment of the invention, a method of patterning (structuring) of at least one (in general a plurality of) MTJ/MCJ stack(s) of an MRAM device includes opening a hardmask layer of an MTJ/MCJ layered structure includes patterning a photoresist layer formed over the hardmask layer, implementing a first etch process to remove exposed portions of the hardmask layer, where the first etch process terminates on an etch stop layer formed over an upper magnetic layer of the MTJ/MCJ layered structure. It further comprises implementing a second etch process to remove the etch stop layer. In the second etch process of etching the etch stop layer at least the upper magnetic layer of the MTJ/MCJ layered structure is also etched using the same etch chemistry.

In the present invention, the etch stop layer for stopping of etching the hardmask layer for the opening thereof is directly deposited on top of the upper magnetic layer (e.g. free layer) of the MTJ/MCJ layered structure. Accordingly, an etch margin in opening the hardmask layer is improved and contact of hardmask open etch chemistry with free layer material is avoided.

The material used for the etch stop layer are:

1) High selectivity to the hardmask layer material during the opening process of the hardmask layer to allow for a very thin etch stop layer, preferably in the order of a few nanometers.

2) Comparable or faster etch rate than MTJ/MCJ stack materials during MTJ/MCJ etch.

3) Negligible or beneficial effects on the properties of the magnetic free layer.

For commonly used etch chemistries and typically used materials for the hardmask layer such as TiN or TaN and typically used materials for the free layer such as NiFe or CoFeB, exemplary materials for the etch stop layer to fulfill above requirements are Ru and NiFeCr alloy.

Depositing the etch stop layer directly over the upper magnetic layer of the MTJ/MCJ layered structure advantageously allows for omitting the cap layer previously deposited directly over the upper magnetic layer of the MTJ/MCJ layered structure. Hence, the etch stop layer not only is used for stopping of etching the hard mask layer for the opening thereof, but also has the function of preventing the MTJ/MCJ layered structure against exposure to the ambient, and particularly to prevent any oxidation thereof. Such protective function of the etch stop layer, for instance, is fulfilled using Ru and/or NiFeCr alloy as etch stop layer material. Compared to a case where an etch stop layer would have been deposited on a conventional cap layer that is deposited over the upper magnetic layer of the MTJ/MCJ layered structure, in the present invention there is no need for a further step to remove the cap layer.

As a further advantage, patterning (structuring) of the MTJ/MCJ layered structure to manufacture MTJ/MCJ stacks of the MRAM cells can be accomplished with the same etch chemistry as for etching the etch stop layer. Accordingly, etching the etch stop layer can be continued to manage to at least etch the upper magnetic layer (e.g. free layer) of the MTJ/MCJ layered structure without a need to change the etch chemistry. In particular, etching may stop on the tunneling barrier layer (i.e. etching of the upper magnetic layer, e.g. free layer); alternatively, etching may stop on Ru (which may be present in the free or reference layers); yet alternatively, etching may stop on the antiferromagnetic layer for pinning of the reference layer fixed magnetization; and yet alternatively, the full MTJ/MCJ stacks may be etched with the same etch chemistry as the etch stop layer. Dependent on a particular etch depth to be achieved, etching may be timed or based on endpoint detection.

Figure 3:
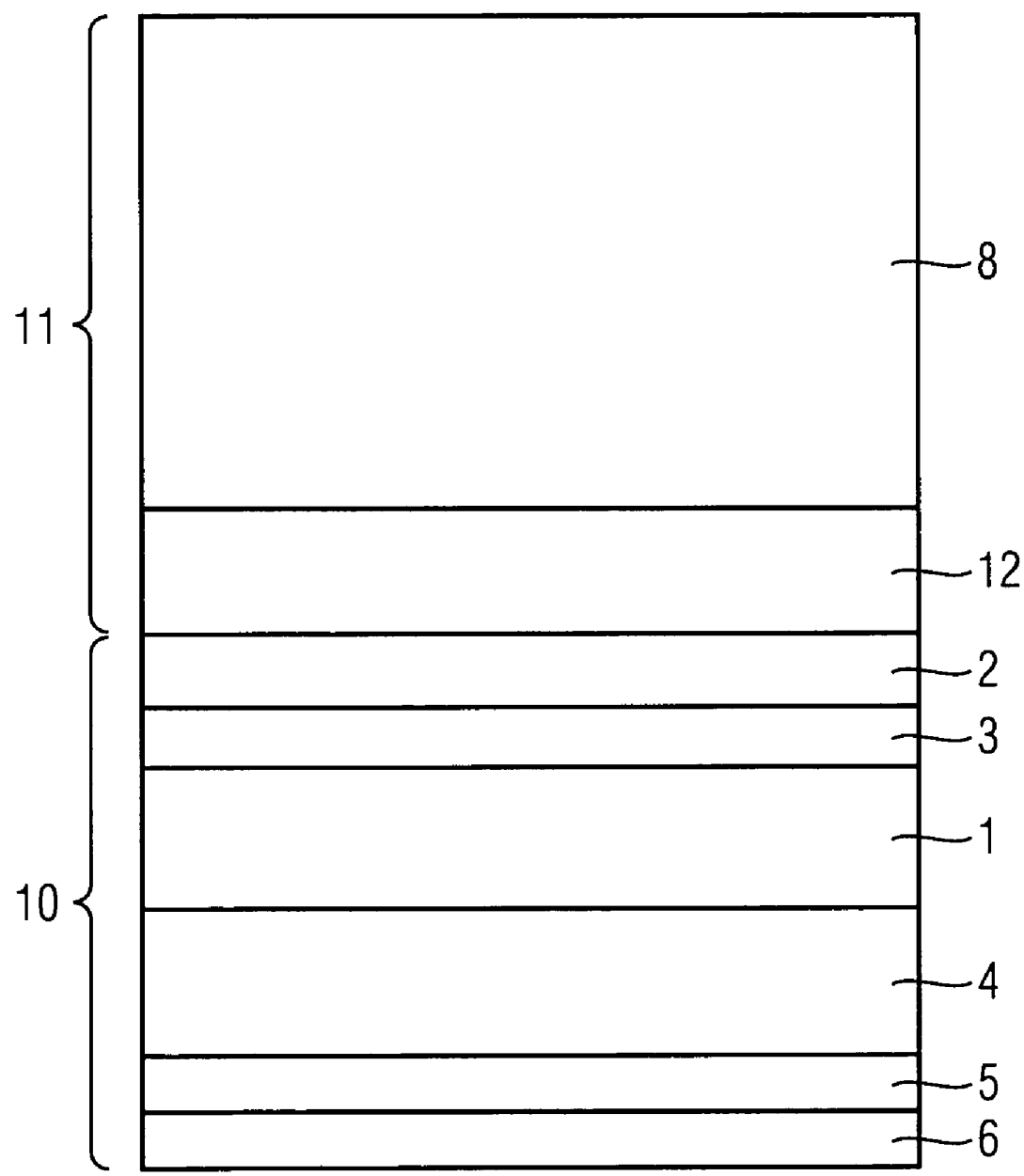
FIG. 3 is a cross sectional view illustrates an intermediate product of an MRAM layered structure with cap structure according to one embodiment of the invention.

Now referring to FIG. 3, an exemplary embodiment of the MTJ/MCJ layered structure with cap structure according to the invention is explained.

As is illustrated, an MTJ/MCJ layered structure (stack of layers), collectively denoted as 10, includes a reference layer 1, a spacer layer 3 (which is a tunneling barrier layer in the case of MTJ or a conductive layer in the case of MCJ) deposited on the reference layer 1 and a free layer 2 deposited on the spacer layer 3. The reference layer 1 is deposited on an antiferromagnetic layer 4 for pinning of the reference layer 1 fixed magnetization. Below the antiferromagnetic layer 4, electrically conductive layers can be provided, for instance a first conductive layer 6 made of TaN and a second conductive layer 5 made of Ta deposited on the first conductive layer 6. The MTJ/MCJ layered structure 10 is for manufacturing one or a plurality of MTJ/MCJ stacks that are the memory elements of the MRAM cells.

It will be appreciated by those skilled in the art that the particular structure of the MTJ/MCJ layered (stacked) structure 10 of FIG. 3 is exemplary only, and that the present invention is equally applicable to other embodiments known to the skilled persons. For instance, the MTJ/MCJ layered structure may be in reverse order and/or have one or more magnetic layers associated with the reference and/or free layers, such as is typical in synthetic antiferromagnetic free layers, and may also have more than one barrier (e.g. stacks with double barriers).

The reference layer 1 typically is made of thin films, for example, consisting of ferromagnetic alloys such as NiFe and CoFe with non-magnetic spacers of Ru, Re, Os, Nb, Cr or alloys thereof. The antiferromagnetic pinning layer 4 typically consists of platinum manganese (PtMn) or iridium manganese (IrMn). The free layer 2 typically is made of thin films, for example, made of ferromagnetic materials with or without non-magnetic spacers such as Ru, Re, Os, Nb, Cr or alloys thereof. In case spacer layer 3 is a tunneling barrier layer (MTJ) layer, spacer layer 3 is typically made of $Al_2O_3$. In case spacer layer 3 is a conductive layer (MCJ), spacer layer 3 is typically made of Cu.

The MTJ/MCJ layered structure 10 typically is deposited over a semiconductor substrate comprising active structures that have been processed, for instance, in a conventional CMOS front-end-of-line processing. On the semiconductor substrate an interlevel dielectric is deposited, typically followed by forming a (first) metallization level within the interlevel dielectric material to form conductive lines for creating magnetic fields to be coupled to the free layer and/or sensing electric resistance of the MRAM cells to be produced.

In the process of manufacturing MRAM cells, after depositing the MTJ/MCJ layered structure 10 a cap structure, collectively denoted as 11, is formed thereupon. The cap structure 11 comprises an etch stop layer 12 formed over an upper magnetic layer (e.g. free layer 2) of the MTJ/MCJ layered structure 10 that typically has a thickness in the order of a few nanometers. The etch stop layer 12 comprises a non-magnetic, electrically conductive material, and, for instance, is made of Ru and/or NiFeCr alloy. Further, the etch stop layer may be selected to be removable using an oxygen based etch chemistry and/or to be corrosion resistant with respect to halogen based etch chemistries and/or to be resistant to post-etch, aqueous cleaning processes. Most preferably, the etch stop layer is selected to be removable using reactive ion etching.

The cap structure 11 further comprises a hardmask layer 8 formed on the etch stop layer 12 to be subsequently opened for patterning of the MTJ/MCJ stacks. The hardmask layer 8 may consist of one or several layers, the materials of which preferably are selected from the group consisting of Ta, TaN, TiN, WN, $SiO_2$ and SiN. Accordingly, the hardmask layer 8 may for instance be comprised of a bilayer that consists of TiN/$SiO_2$. Opening the hardmask layer 8 therefore consists of at least hardmask etch step, where several hardmask etch steps may have different chemistry and etch conditions. Particularly, in case of a hardmask layer 8 comprised of a two layers, such as a TiN/$SiO_2$-bilayer, two hardmask etch steps may be performed.

The etch stop layer 12, apart from its function of stopping etching the cap structure 11 that is to say opening the hardmask layer 8 for patterning (structuring) the MTJ/MCJ stacks, is to protect the MTJ/MCJ layered structure 10 against exposure to the ambient, such as oxidation thereof. Accordingly, as an advantage, it is possible to omit any cap layer deposited on the upper layer of the MTJ/MCJ layered structure 10.

Figure 4:
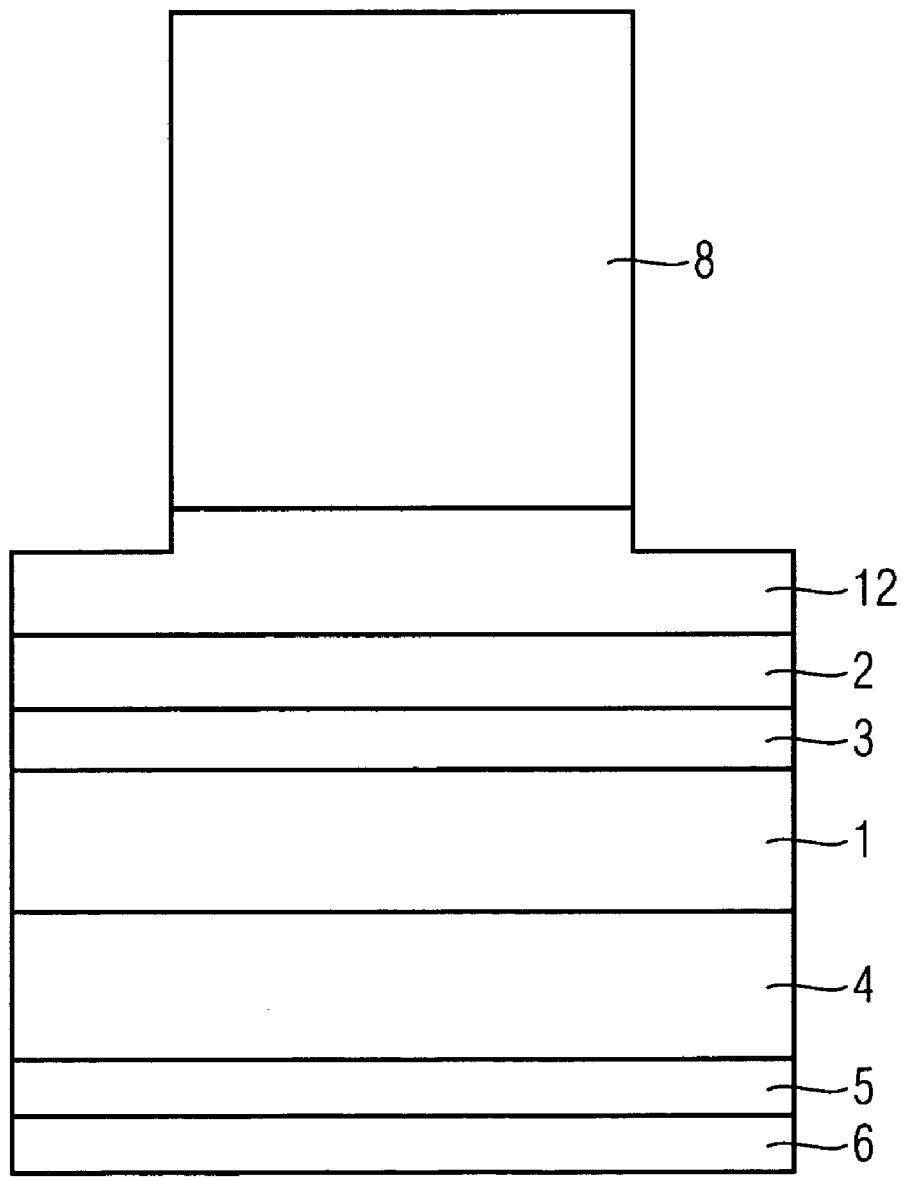
FIG. 4 illustrates the intermediate product of FIG. 3 after opening the hardmask layer.

Reference is made to FIG. 4, illustrating the intermediate product of FIG. 3 after opening the hardmask layer 8. Transferring a lithographic pattern to the MTJ/MCJ stacks, the hardmask layer 8 is structured typically using reactive ion etching (RIE) down to the etch stop layer 12. More specifically, a photoresist material deposited on the hardmask layer 8 is developed into the desired hardmask layer 8 pattern. Then, using the photoresist pattern, the exposed hardmask layer 8 material is removed by RIE with etch stop on (or within) the etch stop layer 12, typically followed by resist-strip. Accordingly, opening the hardmask layer 8, the MTJ/MCJ layered stack 10 is safely prevented from being damaged by etch chemistry.

Figure 5:
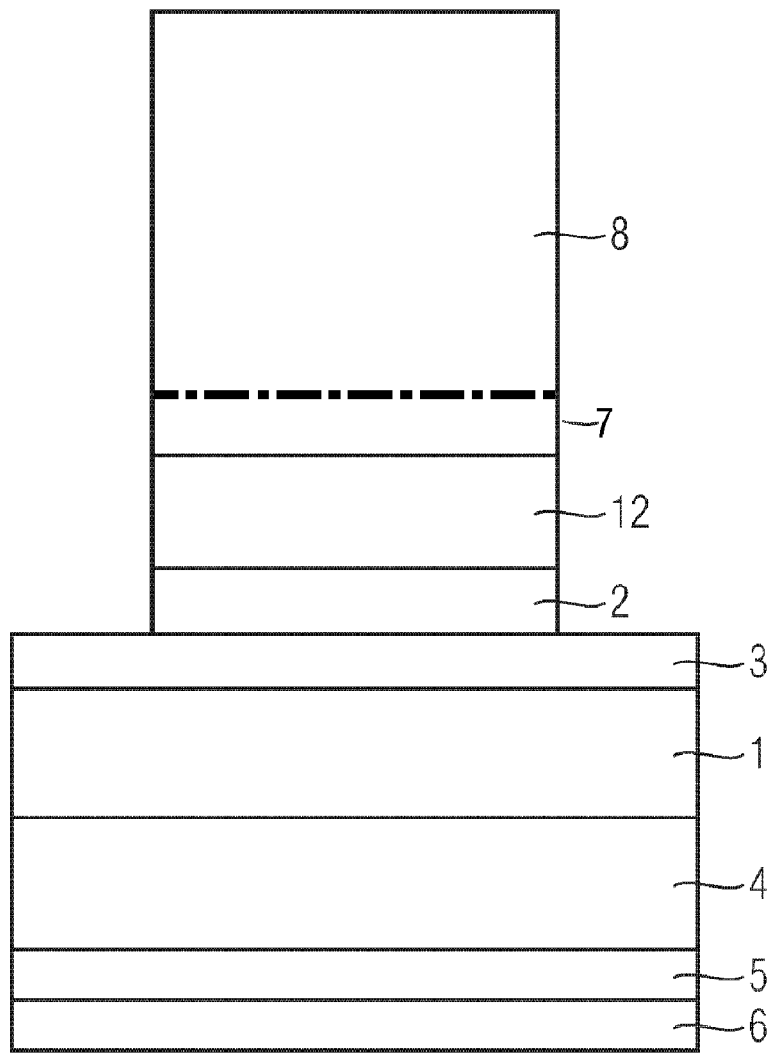
FIG. 5 illustrates the intermediate product of FIG. 4 after etching the etch stop layer and free layer with a same etch chemistry.

Reference is made to FIG. 5, illustrating the intermediate product of FIG. 4 after etching the etch stop layer 12. Accordingly, in a single etch step, the etch stop layer 12 and the upper layer (e.g. free layer 2 as depicted in FIG. 5) of the MTJ/MCJ layered stack 10 have been removed by RIE using same etch chemistry. Etching of both the etch stop and free layers may be effected in a time based or endpoint detection based etching. While not shown in FIG. 5, in a single etch step, the etch stop layer 12 and two or more layers (or parts of layers) of the MTJ/MCJ layered stack 10, can be removed, for instance by RIE using same etch chemistry. Particularly, in a single etch step, etching of the etch stop layer 12 and a full MTJ/MCJ stack can be performed.

Hence, opening the hardmask layer 8 and structuring (patterning) the MTJ/MCJ layered structure 10 to manufacture MTJ/MCJ stacks can be performed in a two-step etch process, i.e. a first etch step to open the hardmask layer 8 and a second etch step to remove the etch stop layer 12 and etching one or more layers (or parts thereof) or structuring the full MTJ/MCJ stacks using the same etch chemistry. In case the hardmask layer 8 is comprised of several layers, etching of the hardmask layer 8 can also be comprised of several etch steps that may have different chemistry and etch conditions.

A cap layer 7 as indicated by the dashed line in FIG. 5 and as conventionally used and described in the introductory portion may be formed on the etch stop layer 12, e.g., made of Ta, TaN or TiN.

In a method of manufacturing MRAM cells, typically, at least one of a deionized water and an acid based aqueous solution rinse following etch of the hardmask layer may be implemented. Otherwise, at least one of a deionized water and an acid based aqueous solution rinse following the removing of the etch stop layer (and optionally part(s) of the MTJ/MCJ layered structure) may be implemented.

After structuring MTJ/MCJ stacks as above-described, conventional steps of CMOS back-end-of-line processing, in principal known to the skilled persons and therefore need not be further detailed, for instance, forming of further conductive lines in one or more metallization levels, respectively separated by interlevel dielectrics, may be performed.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A random access memory comprising:
a magnetoresistive junction having an upper magnetic layer;
a cap structure comprising an etch stop layer formed over the upper magnetic layer, and a hardmask layer formed over the etch stop layer, wherein the etch stop layer material comprises ruthenium (Ru) which is directly in contact with said upper magnetic layer.

2. The memory of claim 1, wherein the etch stop layer material is removable using an oxygen based etch chemistry.

3. The memory of claim 1, wherein the etch stop layer material is selected to be corrosion resistant with respect to halogen based etch chemistries, and the etch stop layer is further selected to be resistant to post-etch, aqueous cleaning processes.

4. The memory of claim 1, wherein the etch stop layer material is removable using reactive ion etching.

5. The memory of claim 1, wherein the hardmask layer material is selected from one or more of the group consisting of tantalum (Ta), tantalum nitride (TaN), titanium nitride (TiN), tungsten nitride (WN), silicon dioxide ($SiO_2$) and silicon nitride (SiN).

6. A magnetoresistive random access memory device comprising:
a magnetoresistive junction (MTJ/MCJ) layered structure having an upper magnetic layer; and
a cap structure comprising an etch stop layer formed over the upper magnetic layer, a cap layer formed over the etch stop layer, and a hardmask layer formed over the cap layer, wherein the etch stop layer comprises ruthenium (Ru) which is directly in contact with said upper magnetic layer.

7. The memory of claim 6, wherein the etch stop layer material is removable using an oxygen based etch chemistry.

8. The memory of claim 6, wherein the etch stop layer material is selected to be corrosion resistant with respect to halogen based etch chemistries, and the etch stop layer is further selected to be resistant to post-etch, aqueous cleaning processes.

9. The cap structure of claim 6, wherein the etch stop layer material is removable using reactive ion etching.

10. The memory of claim 6, wherein the hardmask layer material is selected from one or more of the group consisting of tantalum (Ta), tantalum nitride (TaN), titanium nitride (TiN), tungsten nitride (WN), silicon dioxide ($SiO_2$) and silicon nitride (SiN).

11. The memory of claim 6, wherein the cap layer material is selected from one or more of the group consisting of tantalum (Ta), tantalum nitride (TaN) and titanium nitride (TiN).

12. A random access memory comprising:
a magnetoresistive junction having an upper magnetic layer;
means for providing a cap structure comprising an etch stop layer formed over the upper magnetic layer, and a hardmask layer formed over the etch stop layer, the hardmask layer is selected from one or more of the group consisting of tantalum (Ta), tantalum nitride (TaN), titanium nitride (TiN), tungsten nitride (WN), silicon dioxide ($SiO_2$), and silicon nitride (SiN), and wherein the etch stop layer material comprises ruthenium (Ru) which is directly in contact with said upper magnetic layer.

* * * * *